(12) United States Patent
Miller et al.

(10) Patent No.: US 7,894,510 B2
(45) Date of Patent: Feb. 22, 2011

(54) REMOTE NONLINEARITY DETECTION VIA BURST POWER DITHERING

(75) Inventors: Mark J. Miller, Vista, CA (US);
Aniruddha Das, San Diego, CA (US);
Robert A. Fitting, Carlsbad, CA (US)

(73) Assignee: ViaSat, Inc., Carlsbad, CA (US)

( * ) Notice: Subject to any disclaimer, the term of this patent is extended or adjusted under 35 U.S.C. 154(b) by 847 days.

(21) Appl. No.: 11/772,781

(22) Filed: Jul. 2, 2007

(65) Prior Publication Data

US 2008/0056404 A1   Mar. 6, 2008

Related U.S. Application Data

(60) Provisional application No. 60/806,353, filed on Jun. 30, 2006.

(51) Int. Cl.
*H04B 1/38* (2006.01)
*H04L 25/49* (2006.01)
*H04L 7/00* (2006.01)

(52) U.S. Cl. .................. 375/219; 375/297; 375/358

(58) Field of Classification Search .............. 375/269, 375/273–274, 279, 286, 295, 297, 308, 316, 375/329, 219, 222, 358; 370/252; 455/13.4, 455/232.1, 234.1, 522; 330/123
See application file for complete search history.

(56) References Cited

U.S. PATENT DOCUMENTS

| 5,513,029 | A * | 4/1996 | Roberts ........................ 398/32 |
| 5,673,291 | A | 9/1997 | Dent |
| 6,949,974 | B2 * | 9/2005 | Ohnishi et al. .......... 330/124 R |
| 6,975,582 | B1 | 12/2005 | Karabinis et al. |
| 7,394,311 | B2 * | 7/2008 | Jeckeln et al. .................. 330/10 |
| 7,599,658 | B1 * | 10/2009 | Agarwal et al. ............. 455/13.4 |
| 2002/0027897 | A1 * | 3/2002 | Moulsley et al. ............ 370/342 |
| 2002/0187765 | A1 | 12/2002 | Kozak et al. |
| 2003/0027587 | A1 * | 2/2003 | Proctor, Jr. ................... 455/522 |
| 2003/0223507 | A1 | 12/2003 | De Gaudenzi |
| 2004/0101061 | A1 | 5/2004 | Yoshida |
| 2004/0240578 | A1 | 12/2004 | Thesling |
| 2005/0117549 | A1 * | 6/2005 | Kanterakis et al. .......... 370/335 |
| 2006/0068733 | A1 * | 3/2006 | Wang et al. .............. 455/234.1 |
| 2007/0149126 | A1 * | 6/2007 | Rangan et al. ............. 455/63.1 |

(Continued)

OTHER PUBLICATIONS

Das et al., Remote Non-linearity Detection Via Burst Power Dithering and EM Based SNR Estimation, 2007, Satellite and Space Communications, 2007, IWSSC '07. International Workshop on, pp. 216-220.*

(Continued)

*Primary Examiner* — Tesfaldet Bocure
*Assistant Examiner* — Lawrence B Williams
(74) *Attorney, Agent, or Firm* — Fish & Richardson P.C.

(57) ABSTRACT

Nonlinearity characterization that transmits bursts of information where symbols vary by a value Delta. The bursts can be bursts of a constant power, followed by another burst of a different constant power. An alternative burst system uses interleaved power symbols, where some symbols in a single burst are at the first power and others are at the second power. The signal-to-noise ratio of the two groups of symbols is estimated, and the difference is used to determine whether or not to reduce the amount of saturation in the transmitter.

50 Claims, 6 Drawing Sheets

U.S. PATENT DOCUMENTS

2008/0299923 A1* 12/2008 O'Brien et al. .......... 455/127.1

OTHER PUBLICATIONS

Das, A., et al., "Remote non-linearity detection via burst power dithering and EM based SNR estimation", *IEEE*, pp. 216-220, (2007).

Pauluzzi, D., et al., "A Comparison of SNR Estimation Techniques for the AWGN Channel", *IEEE Transactions on Communications*, 48(10):1681-1691, Oct. 2000.

Wiesel, A., et al., "Non-Data-Aided Signal-to-Noise-Ratio Estimation", *IEEE International Conference on Communications*, vol. 1, pp. 197-201, (2002).

* cited by examiner

FIG. 2B  ALTERNATE BURST DITHER

FIG. 2C  ALTERNATE SYMBOL DITHER (TIME BETWEEN BURSTS = T)

REMOTE NONLINEARITY DETECTION VIA BURST POWER DITHERING

CROSS-REFERENCE TO RELATED APPLICATIONS

This application claims priority to U.S. Provisional Application 60/806,353, filed Jun. 30, 2006. The disclosure of the prior application is considered part of (and is incorporated by reference in) the disclosure of this application.

BACKGROUND

Wireless communication systems typically use an RF power amplifier to carry out the transmission. These power amplifiers are typically linear over only a certain range of input power. Beyond that range, the RF power amplifier will gradually saturate. As link conditions change, a power control loop may adjust the output power of the transmitter to maintain a desired quality of service.

Link conditions can change because of location, channel fade, rain fade, transceiver characteristics such as aging, temperature, condition of the hardware, or myriad other reasons.

It may be useful to detect and/or avoid operating the RF power amplifier in a non-linear region. Avoidance may be important, for example, in certain kinds of modulation schemes which have non-constant envelopes. Saturation and non-linearity can distort these signals and/or cause spectral regrowth.

Systems of this type have estimated the onset of nonlinearity using various techniques. Current sensing techniques, correlation methods, and subsampling techniques may require specialized hardware at the amplifier. Other techniques may estimate nonlinearity in a power amplifier that communicates with a satellite modem. This system may add to the cost of the unit. US Patent Publication number 2002/405781 describes a system that requires knowledge of the transmitted data sequence and models the transmission amplifier based thereon.

It is possible to measure the transmitted power at a transmitted output, e.g., the output of the outdoor satellite unit. In such a system, the onset of saturation would be detected as the power levels increase. Such a system would require additional hardware at the outdoor unit. It could also require hardware in the data channel in order to transmit the telemetry back to the modulator.

The onset of saturation can be met with remedial measures such as reducing the data rate or changing to a more robust coding or modulation scheme.

SUMMARY

An embodiment discloses detecting saturation in a transmitter by measuring signal parameters at the receiver.

According to an embodiment, this is done by measuring special characteristics of a received signal which has been dithered in a known way.

Embodiments include detecting the onset of saturation at the remote receiver.

An embodiment uses a dithering technique which sends transmissions with a known difference in transmit power between different parts of the transmission. The receiver measures this difference and determines if the received difference is within a specified amount of the transmitted difference.

Another aspect relates to change of the remote terminal to a different set of characteristics e.g. to a different channel. The different channel can be, for example, at a lower symbol rate, lower order modulation, or different (e.g., more robust) coding scheme. Any of these things may allow a remote terminal to back off on power and avoid the saturation.

DETAILED DESCRIPTION

An embodiment disclosed herein relates to a satellite communication system. One embodiment relates to the SurfBeam satellite system available from Viasat Inc. This satellite system is based on the data over cable service interface specification or DOCSIS. SurfBeam is used with geostationary spot beam satellites in the Ka or Ku band.

SurfBeam uses an upper layer protocol which is based on DOCSIS. Surfbeam also uses QPSK with a forward error correction rate of either ½ or ¾. Return link symbol rates can be at desired speed such as 2560, 1280, or 640 K symbols per second. The return link operates over a multifrequency time division multiple access system.

DOCSIS requires each satellite modem to periodically transmit a ranging burst (RNG-REQ) regardless of whether data is present or not. Different types of ranging bursts can be used, but in an embodiment, the ranging burst may be 36 bytes of data with a 110 symbol preamble. The preamble is uncoded, and the data portion is coded by the forward error correction of the channel.

Thus, at QPSK rate ½, the ranging burst is the 110 symbol preamble, and 288 symbols. Analogously, at QPSK ¾, the ranging burst is a 110 symbol preamble, and 192 symbols of data. The preamble overhead may be large because the system has been optimized for data bursts that are typically much larger than the 36 byte ranging burst.

An embodiment disclosed herein is disclosed in the environment of DOCSIS, however, this technique may be wholly independent of DOCSIS, and will work for any system which allows changing power in a "burst". The power can be transmitted by an RF transmitter, or by any other kind of transmitter that can transmit at multiple different powers.

The burst can be a periodic burst, having N bytes every T seconds. Another embodiment allows the bursts to have varying powers in any desired way.

The bursts can be used for synchronization, power control, link maintenance, channel estimation or any other purpose.

Figure 1A:
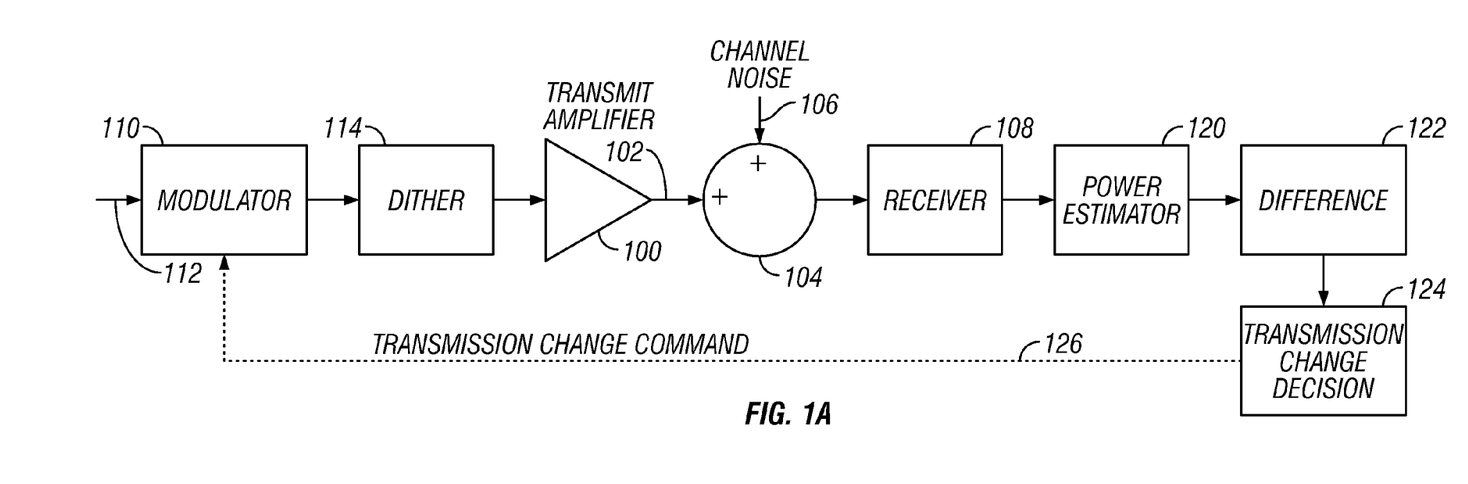
FIG. 1A shows an embodiment wherein a transmit amplifier produces a transmitted output which is sent over a channel.

FIG. 1A illustrates an embodiment. A transmit amplifier 100 produces a transmitted output 102 which is sent over a channel 104 in a non-constant envelope format, e.g., M-ary Phase Shift Keying (MPSK), when used with bandlimiting pulses such as Square Root Raised Cosine (SRRC) is an exemplary non-constant envelope format.

The channel has its own inherent source of channel noise 106 which is shown as additive to the transmitted signal. The signal is received in a receiver 108.

In an embodiment, the transmitted signal is produced by a modulator 110 based on desired content shown as 112. The output of the modulator 110 is coupled to a dither unit 114 which applies a power dither to the signal as described further herein.

The received signal from the receiver is sent to a dither power estimator 120 which estimates the power in the dither part of the transmitted signal. Difference detector 122 compares the received dither with a known dither amount to find a difference. Based on this comparison, a transmission change decision module determines whether to change a characteristic of the transmission. A command 126 indicative of the decision is sent to the modulator 110.

Figure 2A:
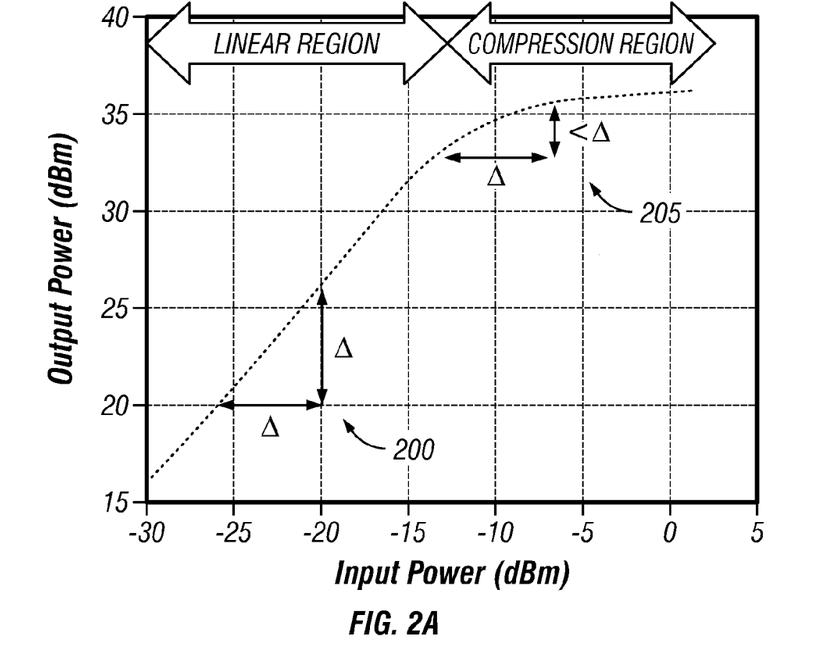
FIG. 2A shows the relationship between the input power dither and estimated output power dither.

Saturation can be detected based on the relationship between the input power dither and estimated output power dither in a typical communication amplifier, as shown in FIG. 2A. At lower powers, the amplifier may exhibit linear operation such as shown by area 200. At these lower powers as in 200, the output power linearly increases based on changes to the input power. An increase in input power of Delta will result in a similar increase Delta in output power.

However, as the input power increases, increasing the input power by Delta will result in an increase of output power of something less than Delta. Area 205 illustrates this nonlinear region, called the compression region. Input power increases of Delta in the compression region result in output power increases of less than Delta.

As described above, this non-linear operation may lead to severe problems with communication, especially when used with a non-constant envelope modulation scheme, such as QPSK or M-QAM.

The power dither described herein tests whether the power amplifier is linear or compressing. The dither signals are signals that differ by Delta dB. There are a number of different embodiments described herein which apply the power dither.

The dither is applied to a burst—e.g., a group of temporally contiguous symbols.

Figure 2B:
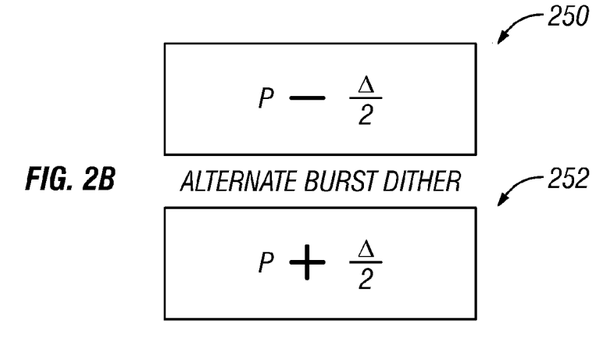
FIG. 2B illustrates a first embodiment.

According to a first embodiment illustrated in FIG. 2B, the terminal transmits alternating and spaced bursts that differ by Delta dB. Delta dB is preferably a larger amount of power than would be experienced during the normal MPSK transmission. A first burst 250 is at power P−Delta/2, and a second burst 252, is at power P+Delta/2 or, more generally, P+x and P−y. The bursts can be separated by a time t, which can be any amount, but is preferably less than 5 seconds or 10 seconds if measuring environmental conditions. If measuring channel changes, then it may vary from a few ms, up to a few seconds. Any fading characteristic adversely affects the Delta power measured at the gateway, and therefore it may be advantageous to separate the bursts by less time in order to accommodate faster fade conditions. If measuring a different thing, e.g., aging of the power amplifier, then the amount of time between bursts can be any value.

An advantage of this technique is that the nominal power of each burst can be set by the power control loop that runs at the gateway, and hence the terminal does not need special hardware to accommodate this embodiment.

Figure 2C:
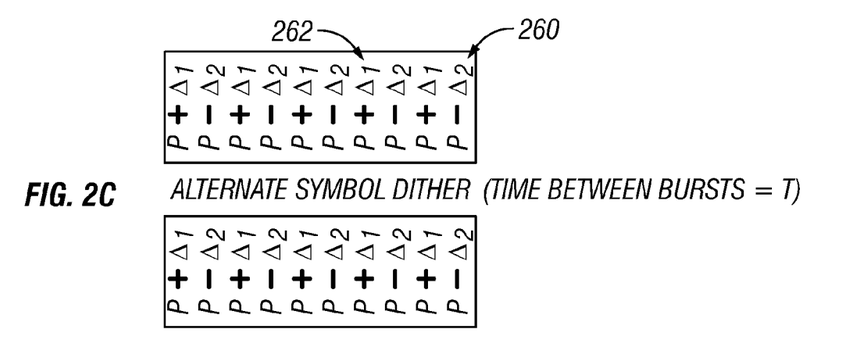
FIG. 2C illustrates a second embodiment.

A second embodiment shown in FIG. 2E 2C transmits bursts where alternating symbols within the same burst differ by Delta dB. For example, each even symbol such as 260 can be transmitted at P−X dB, and each odd symbol such as 262 can be transmitted at P+Y dB. This results in a net Delta of Y+X dB. In this embodiment, the terminal applies a symbol-by-symbol power dither. The power control loop in this embodiment runs on a symbol by symbol basis. An alternative can use multiple symbols at each power, e.g., 2 symbols at each power or 3 symbols at each power.

Another embodiment may use a dither that has multiple different powers within the burst, e.g., 3 or 4 or 5 power levels within the burst. The powers could be, for example, P−X dB, P dB and P+Y dB.

This embodiment requires that the power amplifier be fast enough to respond to changes in signal power at the transmitter, and hence requires that the difference between these alternative symbols be large enough to be discernible.

X and y can be selected to allow the average power burst to remain P dB, thereby ensuring that the average power over the channel stays constant.

Another embodiment may be used in cases where the response time of the amplifier is not fast enough to react to symbol time durations. In this embodiment, a dither may be used in which the first portion of the burst is transmitted at P−X dB, and a second portion of the burst is transmitted at P+Y dB. The portions can be equal (e.g., 50/50), or unequal (e.g., ⅓, ⅔). Since the higher signal to noise ratios are easier to estimate, the portion can have ⅓ of the symbols at the higher power, the other ⅔ at the lower power.

Any desired interleaving of power within the bursts can be used.

This embodiment produces varying signal power over the burst duration that is not affected by fade. The bursts may be on the order of milliseconds in duration, for example. Atmospheric conditions are typically constant over time scales of that duration. Moreover, a tighter control over the average power of the bursts can be maintained.

Figure 1B:
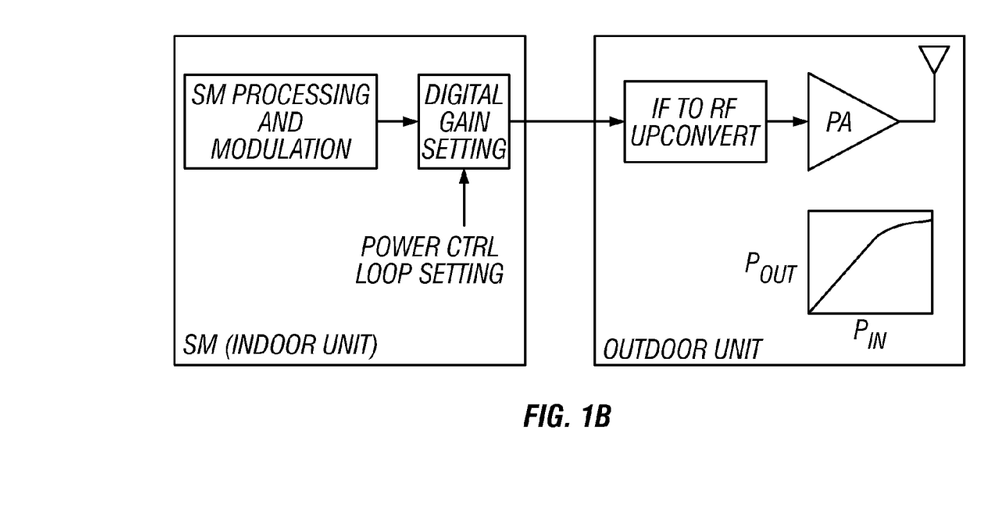
FIG. 1B illustrates the loop for the satellite modem.

The receiver 108 in this embodiment includes a power estimator 120 which estimates the difference in power between the received signals in the two different transmit power regions. This difference shown as 122 is used to ascertain whether the nonlinearity occurs. Once the nonlinearity is detected, terminal adaptation at 124 is initiated to change the transmission characteristics. This can use a lower transmit power or different techniques to move the transmitted amplifier into the linear region. Alternatively, during a signal state such as a rain event, the upstream power control loop may instruct the transmitter to increase its signal power until the signal-to-noise ratio target is achieved. In an embodiment such as FIG. 1B, which illustrates the loop for the satellite modem, the modem is connected to the outdoor unit over a cable. The modem cannot determine the cable loss to the outdoor unit or Pin to Pout characteristics of the outdoor unit. Hence, the modem does not get any indication of the actual increase or decrease in signal power.

Figure 3:
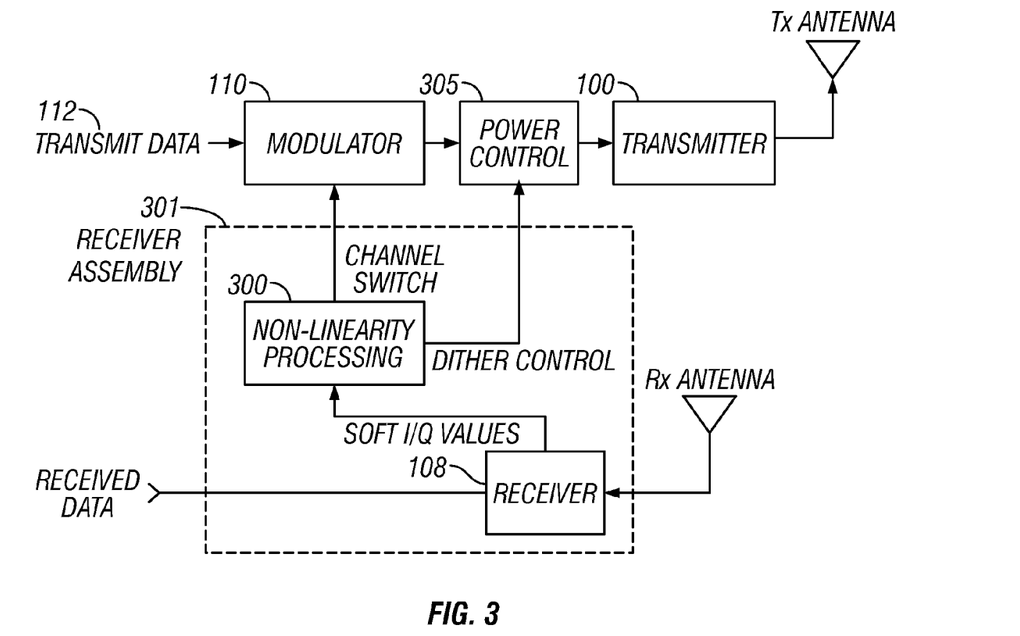
FIG. 3 shows a block diagram form of nonlinearity processing.

An exemplary nonlinearity processing is shown in block diagram form in FIG. 3. This carries out a processing to estimate whether the power amplifier 100 is operating in the linear region 200 or in the compression region 205. FIG. 1A explains how a dithered signal is transmitted by the transmitter 100, and received by the receiver 108. The values received by the receiver, which can be for example soft I and Q values, are sent to a nonlinearity processing block 300. In FIG. 3, the nonlinearity processing block 300 is part of the receiver assembly 301, however, it can be a totally separate circuit. The nonlinearity processing block 300 estimates received power differences between the dithered bursts. This detects the onset of saturation and forwards commands to a power control module 305 that controls characteristics of the transmitting terminal 100. The power control module 305 can change channels, change transmission characteristics, or the like.

The dither characteristics, such as the amount of dither or rate of dither can also be modified. For example, during an increasing fade rate, the dithering rate can be increased to better track the rate of fade. In addition, dither can be turned off by this system when its characteristics are such that nonlinearities are unlikely, e.g., at lower power. In this embodiment, the soft decision I and Q values of the remote receiver are provided to the nonlinearity processing.

Figure 4:
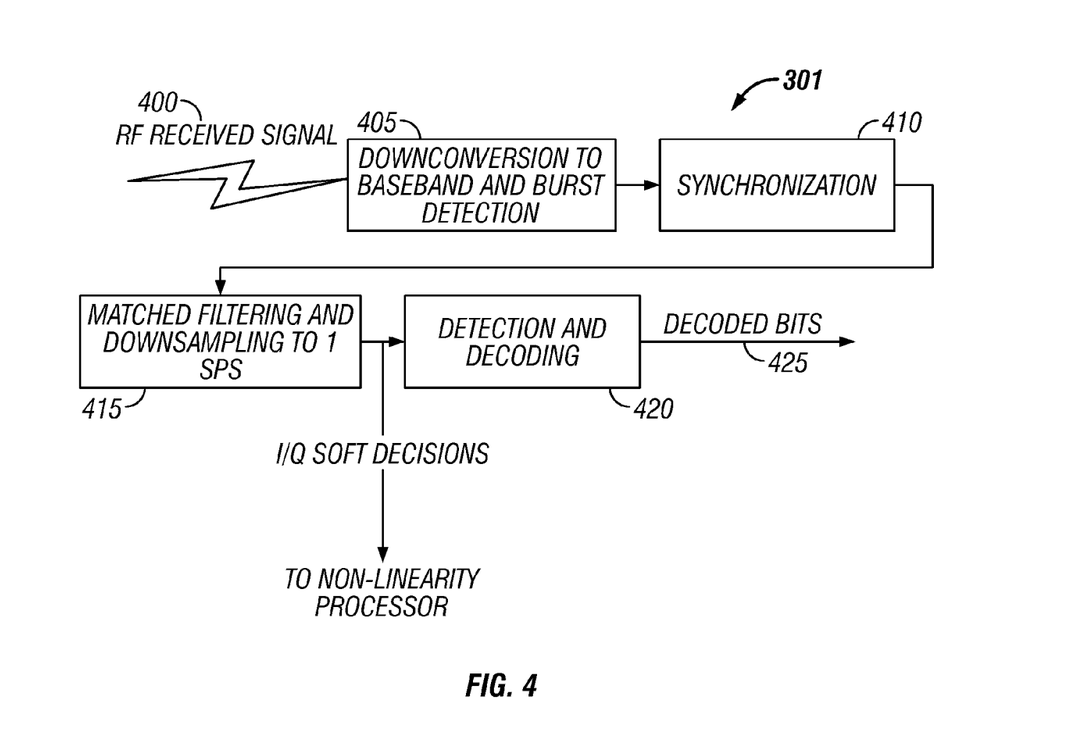
FIG. 4 illustrates a detail of the receiver assembly.

FIG. 4 illustrates a detail of the receiver assembly 301 carrying out these operations. RF received signal 400 is first downconverted by a downconverter 405, which downconverts to baseband and carries out burst detection.

Baseband burst parts are synchronously detected in a synchronizer 410. A matched filter is used and the output is downsampled at 415. Detection and decoding is carried out at 420 to produce decoded bits at 425.

The received power detection can be carried out by either measuring the signal amplitude or power of the received signal in a first embodiment, or by measuring a signal-to-noise ratio of the signal at the receiver in a second embodiment.

An embodiment accurately detects a difference in received power between dithered bursts by measuring the difference in SNR at the receiver.

"Non-Data-Aided Signal-to-Noise Ratio Estimation," Wiesel, et al, described using the Expectation-Maximization (EM) algorithm to estimate the SNR for BPSK (but not QPSK). Moreover, their usage of the EM algorithm results in a solution that requires huge matrix manipulations. "A comparison of SNR Estimation Techniques for the AWGN Channel," Pauluzzi et al described several sub-optimal schemes and the maximum-likelihood estimator (but the latter requires knowledge of the transmitted bits).

Figure 5:
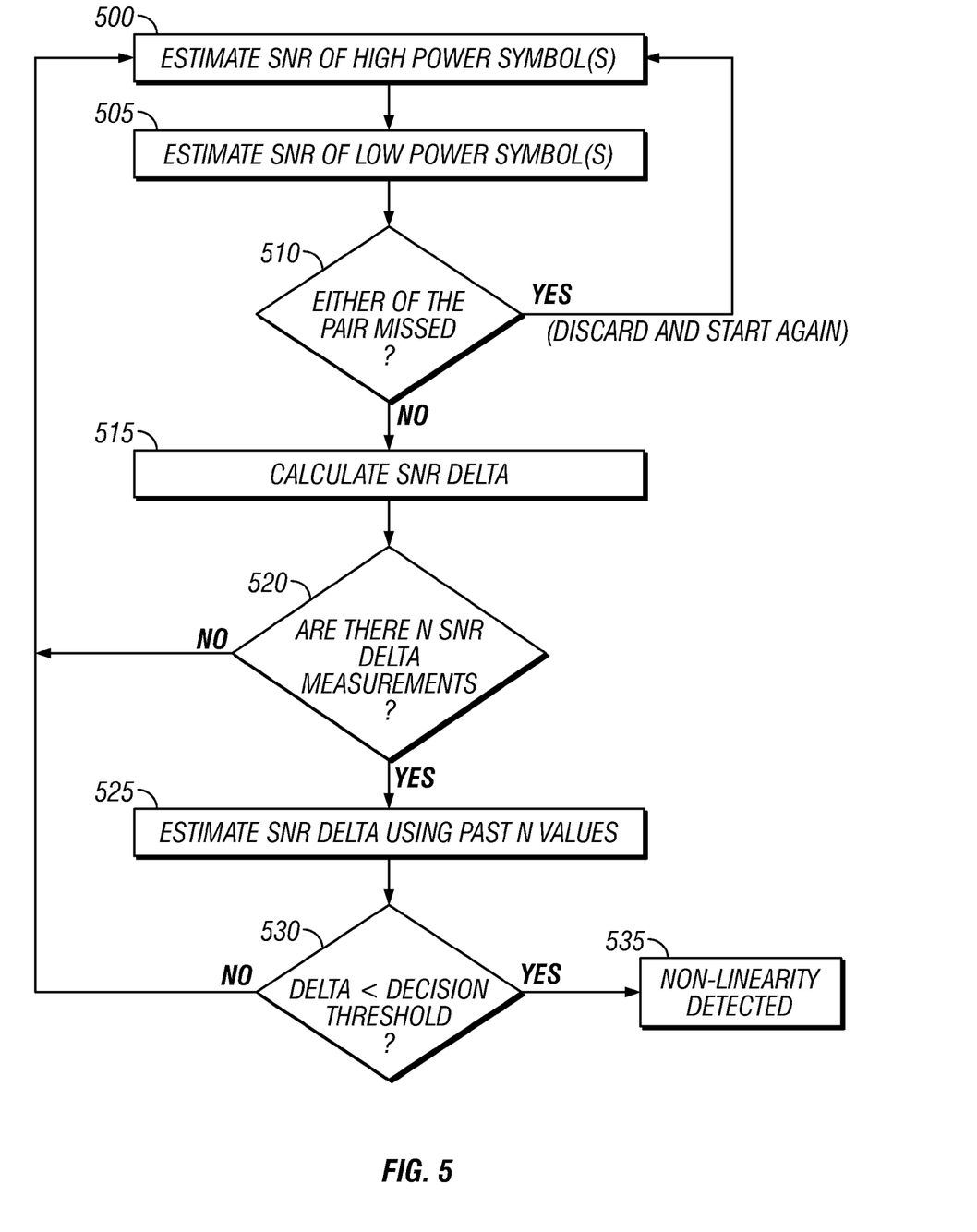
FIG. 5 shows a flow diagram of the processor or the existing field programmable gate array.

An embodiment can use either a processor or the existing field programmable gate array to carry out the flow diagram of FIG. 5. While this embodiment describes received data being in bursts, it can also be applied to continuous transmissions.

An embodiment describes estimating the differences and received power between different dithered bursts by comparing the signal-to-noise ratio of each bursts. Bursts received with a higher power will have a higher signal-to-noise ratio. FIG. 5 operates by first estimating the signal-to-noise ratio of the high power symbol(s) at 500 and next estimating the signal-to-noise ratio of the lower power symbol(s) at 505. As described above, the symbol(s) can be single or multiple symbols, or can be an entire burst.

At 510, it is determined whether either of the high power or low power part have been missed. If so, the samples are discarded and started again via flow passing to 500. If both of the samples are there, then the signal-to-noise ratio difference, Delta, is estimated at 515. For example, this may estimate the signal-to-noise ratio difference between the even and odd numbered symbols or bursts. This result represents the difference in power between the original transmissions.

520 represents the operation of this embodiment of collecting a number N of these signal-to-noise ratio differences prior to establishing them as being correct. This is done to perform a more precise estimation of the actual signal-to-noise ratio differences. The differences should be the same or similar to that applied by the generator. The estimated past N values can be used at 525. If the Delta is lesser than the threshold of determination of 530, and it is used as an indication of a nonlinearity at 535.

This flowchart shows a simple yes or no determination, however it is also possible to quantify the amount of compression to for example show large nonlinearity/small nonlinearity/or to show x percent nonlinearity.

The decision threshold can be selected taking into account a trade-off between the probability of false detection and the probability of misdetection. If the transmitter is operating in a static mode, the probability of false detection should probably be reduced to a relatively low level.

After detecting nonlinearity, a channel change can be carried out where the terminal's transmission characteristics are adapted. Channel change can be, as above, transmitting a lower symbol rate, a lower order modulation scheme, a use of a more robust code rate, or other techniques.

Figure 6:
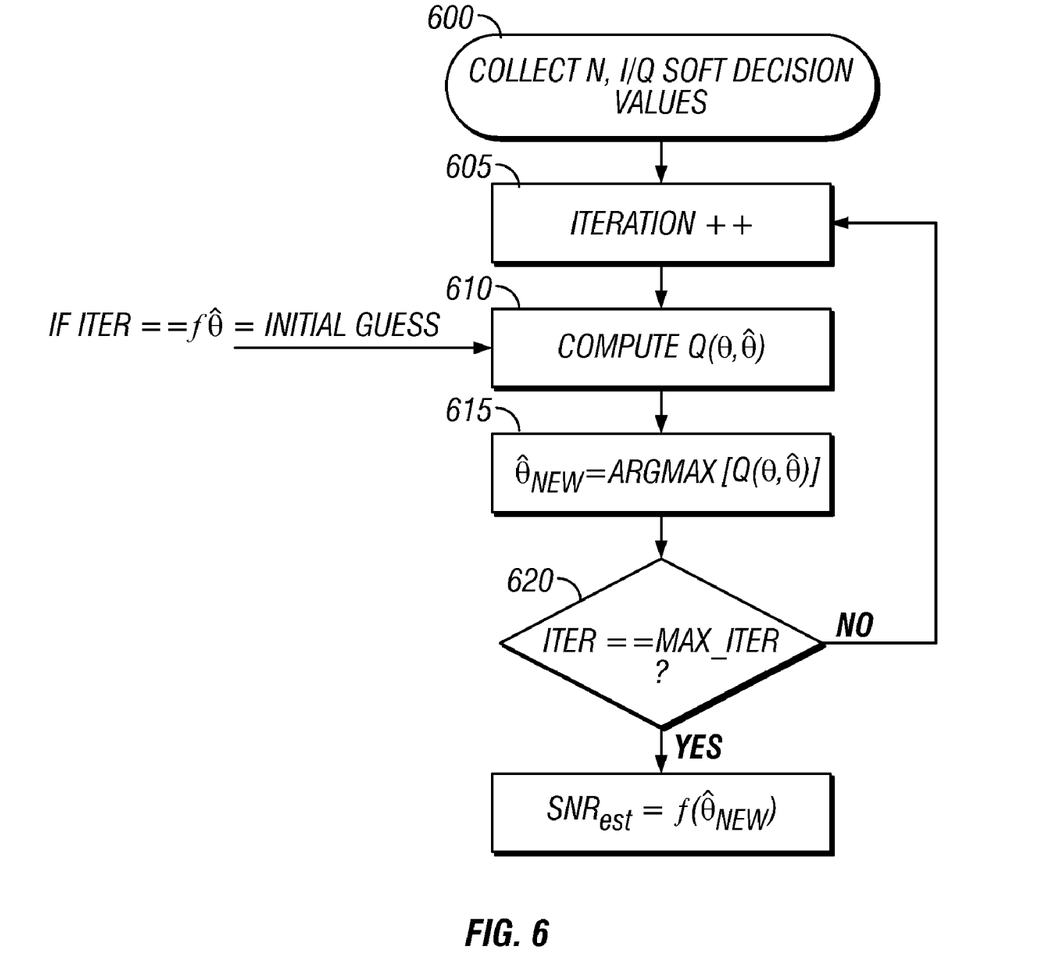
FIG. 6 illustrates the measurement of signal-to-noise ratio.

Measurement of signal-to-noise ratio is shown in FIG. 6. FIG. 6 illustrates this estimation being carried out using an expectation maximization algorithm. Expectation maximization may be used, since it is believed to be the best possible way of detecting signal to noise: it can asymptotically attain the maximum likelihood solution under certain circumstances.

The expectation maximization first operates by collecting the I and Q soft values at 600. It is assumed that there is some hidden data in each received symbol. That hidden data may be the transmitted and unknown symbol. Therefore, an iterative operation is carried out beginning at 605. The EM algorithm is a non-data aided technique that can be shown to asymptotically attain the maximum-likelihood solution, under certain conditions.

The iteration begins at 610, with computing the log likelihood of the complete data, conditioned on the received symbols and the current guess for the parameters to be estimated. The expectation of the complete data log likelihood, given by $Q(\theta,\hat{\theta})$ is also computed. This is known as the E-step or the Expectation Step. At 615, the parameters to be estimated are updated by $\hat{\theta}_{new} = \arg\max\{Q(\theta,\hat{\theta})\}$ 620 detects if the number of iterations are complete—and if so returns to 605.

An embodiment for QPSK is described in detail herein.

To determine the SNR of QPSK, it is assumed that the output of the matched filter is devoid of any timing, frequency or phase errors and are symbol spaced. Thus, the output of the matched filter may be expressed as $$y_n = h a_n + w_n \quad n = 1 \ldots N \tag{1}$$

where $y_n$ are the symbol spaced complex matched filter outputs, h is the unknown but fixed scalar channel gain, $w_n$ is a realization of a circularly symmetric complex Gaussian random variable of variance $\sigma^2$ and $a_n$ is the n-th complex transmitted symbol belonging to the set $$\left\{ \pm \frac{1}{\sqrt{2}} \pm j \frac{1}{\sqrt{2}} \right\}$$

and N is the total number of symbols over which the SNR is being estimated.

The estimation problem is the following: Given an N×1 vector of observations, y, to estimate the signal to noise ratio given by SNR=$\rho = h^2/\sigma^2$. The EM algorithm is used to estimate maximum likelihood estimates of h and $\sigma^2$ and then the maximum likelihood estimate of the SNR is found using the invariance property of the maximum likelihood estimate. Thus, if $\hat{h}$ is the maximum likelihood estimate of h, and $\hat{\sigma}^2$ is the maximum likelihood estimate of $\hat{\sigma}^2$, then the maximum likelihood estimate of the SNR, $\rho$, is given by $\hat{\rho} = \hat{h}^2/\hat{\sigma}^2$.

The EM algorithm works on a set of incomplete data. In this case, the incomplete data is the sequence of (unknown) transmitted symbols, $a_n$. Thus the complete data set is defined to be $z=[y; a]$. Since it is known that $a_n$ can take one of four different values, it is concluded that the observed samples $y_n$ is a mixture density of four Gaussian mixtures. Thus the probability density function (pdf) Of $y_n$ may be written as:

$$f_Y(y_n) = \sum_{\ell=1}^{4} \alpha_\ell p_\ell(y_n \mid \theta) \tag{2a}$$

$$= \sum_{\ell=1}^{4} \alpha_\ell \frac{1}{\pi \sigma_\ell^2} \exp\left(\frac{-(y_n - h_\ell a_n)^H (y_n - h_\ell a_n)}{\sigma_\ell^2}\right) \tag{2b}$$

Where $\alpha_l$ is the (unknown) proportion of the l-th mixture in the overall distribution and so is subject to the following two constraints:

$$\sum_{\ell=1}^{4} \alpha_\ell = 1 \text{ and } 0 \leq \alpha_l \leq 1 \tag{3}$$

Here, the reasonable assumption can be made that all the $h_l$ and all the $\sigma_l^2$ are identical, since all the four component densities are exposed to the same channel gain and noise. Hence, from here on in, notationally, the values will be treated as being the same: one h, one $\sigma^2$.

The unknown parameter set, $\theta$, can be put in vector form as $$\theta = [h, \sigma^2, \alpha_1, \alpha_2, \alpha_3, \alpha_4]^T. \tag{4}$$

The i-th step of the iterative EM algorithm carries out the following two steps:

E-Step $Q(\theta_i; \theta_{i-1}) = E[L(\theta|Z)|Y, \theta_{i-1}]$ (5a)

M-Step $\theta_i = \text{argmax} Q(\theta_i; \theta_{i-1})$ (5b)

In order to carry out the E-Step, the full information log likelihood function, $L(\theta|Z)$, is required. Assuming independent data, the likelihood function may be computed as:

$$L(\theta \mid Z) = \prod_{k=1}^{N} \prod_{\ell=1}^{4} p_\ell(y_k \mid a_k, \theta)^{\chi_{k,\ell}} p(a_\ell \mid \theta)^{\chi_{k,\ell}} \tag{6}$$

Where $\chi_{k,l}$ is the indicator function that equals 1 if $a_k = a_l$ and is 0 otherwise.

The log likelihood function can then be computed as $$\text{Log}[L(\Theta \mid z)] = \sum_{k=1}^{N} \sum_{l=1}^{4} x_{k,l}(\log(\alpha_l) + \log(p_l(y_k \mid \Theta))) \tag{7a}$$

$$\mathcal{L}(\Theta \mid z) = \sum_{k=1}^{N} x_k^T [V(\alpha) + U_k(\Theta)] \tag{7b}$$

where $x_k^T$ is a 4×1 vector of $\chi_{k,l}$, $V(\alpha)$ and $U_k(\theta)$ are 4×1 vectors of $\log(\alpha_l)$ and $\log(p_l(y_k/\theta))$ respectively. With knowledge of the complete data, $x_k^T$ is one of the following 4 vectors: $[1,0,0,0]^T$, $[0,1,0,0]^T$, $[0,0,1,0]^T$, $[0,0,0,1]^T$.

In performing the E-step, it is noted that given y and $\theta_{i-1}$, the only random part of the log likelihood function is $x_k^T$. Thus, for each iteration, this value is updated to obtain the soft decision $(x_k^T)^+$. Using current estimates, according to the equations:

$$x_{k,l}^+ = E[x_{k,l} \mid y, \Theta_{i-1}] \tag{8a}$$

$$= \frac{\alpha_l \exp\left(\frac{-(y_k - ha_l)^N (y_k - ha_l)}{\sigma^2}\right)}{\sum_{i=1}^{4} \alpha_i \exp\left(\frac{-(y_k - ha_i)^N (y_k - ha_i)}{\sigma^2}\right)} \tag{8b}$$

The M-Step is used to update the estimates. Under the assumptions that the difference parameters are independent, the following optimization equation follow for updating h and $\sigma^2$.

$$\frac{\partial Q}{\partial h} = \frac{\partial}{\partial h} \sum_{k=1}^{N} \sum_{l=1}^{4} x_{k,l}^+ \left(\log \sigma^2 + \frac{\|y_k - ha_l\|^2}{\sigma^2}\right) = 0 \tag{9a}$$

$$\Rightarrow \sum_{k=1}^{N} \sum_{l=1}^{4} x_{k,l}^+ (2h - (y_k a_l^* + a_l y_k^*)) = 0 \tag{9b}$$

$$\frac{\partial Q}{\partial \sigma^2} = \sum_{k=1}^{N} \sum_{l=1}^{4} x_{k,l}^+ \left(\frac{1}{\sigma^2} - \frac{\|y_k - ha_l\|^2}{\sigma^2}\right) = 0 \tag{9c}$$

The optimization of $\alpha$ may be done using Lagrange multipliers, $\lambda$, using $$\frac{\partial Q}{\partial \alpha} \left[\sum_{k=1}^{N} (x_k^T)^+ \log(\alpha) + \lambda \left(1 - \sum_{l=1}^{4} \alpha_l\right)\right] = 0 \tag{10}$$

These yield the following solutions where the + sign indicates the updated parameters of the i-th iteration and * indicates conjugation.

$$\alpha_l^+ = \frac{\sum_{k=1}^{N} x_{k,l}^+}{N} \tag{11a}$$

$$h^+ = \frac{1}{(2N)} \sum_{k=1}^{N} (x_k^T)^+ (y_k a^* + ay_k^*) \tag{11b}$$

$$\sigma^{2+} = \frac{1}{N} \sum_{k=1}^{N} (x_k^T)^+ \|y_k - h^+ a\|^2 \tag{11c}$$

$$\hat{SNR} = \frac{(h^+)^2}{\sigma^{2+}} \tag{11d}$$

The SNR estimator using the EM algorithm may be implemented in Field Programmable Gate Arrays (FPGA). The equations that need to be implemented in hardware are Eqns. 8 and 11. Of these equations, Eqn. 8 is much more challenging to implement in digital hardware due to two reasons. First, there is the need to carry out N divisions for the normalization of each $x_k$ and a division by $\sigma^2$. thus requiring (N+1) divisions for each iteration. It is assumed that since FPGAs typically have a fairly large number of dedicated multipliers, first the quantity $1/\sigma^2$ will be calculated, (1 division) and then multipliers will be used to carry out the rest of eqn. 8. Secondly, there is the need to update all 4N entries of $x_{k,l}$ every iteration. For efficient implementation, the exponential functions could be implemented as look up tables in FPGA Block Memory. Eqn. 11 may be simpler to implement assuming dedicated multipliers and adders are available in the FPGA.

The iterative algorithm of this embodiment is challenging to implement. This is especially so considering that the design is required to support thousands of SMs on a particular channel.

Another embodiment describes a simpler soft decision based SNR estimation algorithm.

A first embodiment operates by using the presence of some known data symbols in the bursts being used for SNR estimation. In the system of interest, 110 symbols of each burst is a known preamble. In general, the target system is assumed to know M of the N symbols in the burst. This is a reasonable assumption, as the vast majority of burst-based systems will have a preamble in the burst for acquisition purposes. Thus in generating the N×4 entries of Eqn. 8, the first M rows are hard decision values and do not require any iteration.

Figure 7:
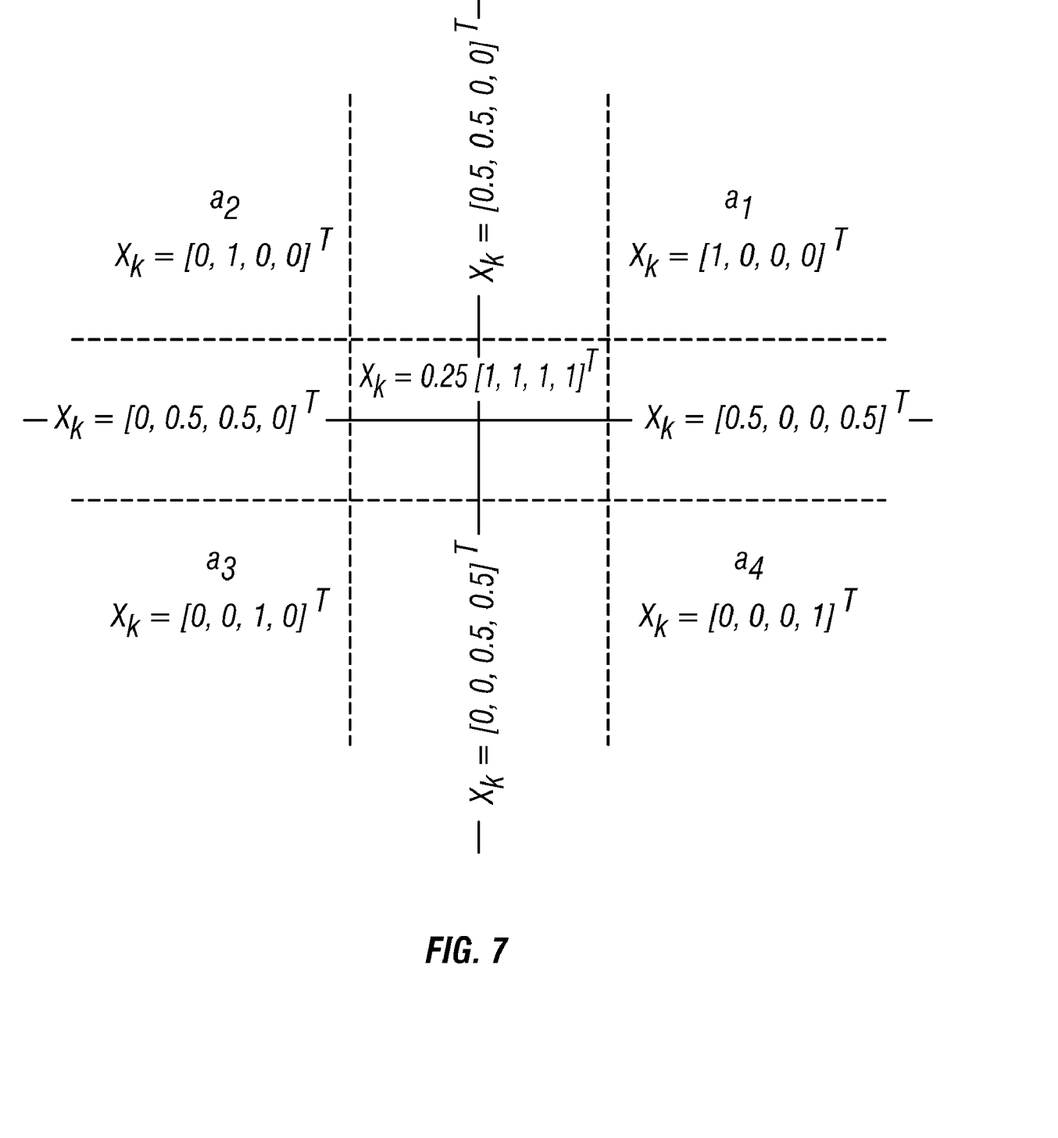
FIG. 7 illustrates the zones of uncertainties.

A second embodiment carries out further simplifications by quantizing the probability of a particular observation coming from one of the transmitted symbols into one of P levels. A particularly efficient scheme uses only four levels. Thus the $x_{k,l+s}$ of eqn. 8 are quantized to one of four values: 0, ¼, ½ and 1. The case where the probabilities are quantized to only two levels (0 and 1) is the degenerate case of using only hard decisions instead of using soft-decisions. Quantizing the probabilities divides up the received I-Q space into what we call zones of uncertainties. This is shown in FIG. 7. Thus for instance, if the received symbol is detected in the top right hand corner of the I-Q map near a1, the $x_k$ is quantized to $[1,0,0,0]^T$.

This greatly simplifies the detection, since it obviates the need for lookup tables and divisions in the implementation of Eqn. 8. Moreover, calculating $x_k$ does not depend on the current estimate of the parameter set to be estimated. Thus the algorithm is no longer an iterative one. This simplification comes at the cost of some degradation in performance in comparison to the full soft-decision iterative EM algorithm. The actual performance degradation is, however, small in the SNR range of interest.

The general structure and techniques, and more specific embodiments which can be used to effect different ways of carrying out the more general goals are described herein.

Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, the above describes transmitters and receivers, but also can cover repeaters, for example.

Also, the inventors intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The computer may be a Pentium class computer, running Windows XP or Linux, or may be a Macintosh computer. The computing may alternatively be done in FPGAs. The programs may be written in C, or Java, or any other programming language. The programs may be resident on a storage medium, e.g., magnetic or optical, e.g. the computer hard drive, a removable disk or other removable medium. The programs may also be run over a network, for example, with a server or other machine sending signals to the local machine, which allows the local machine to carry out the operations described herein.

What is claimed is:

1. A method comprising:
transmitting a signal that includes information symbols and is in a format encoded with a non-constant envelope, said signal also includes a first part at a first power level, a second part at a second power level, having a known and definite difference between said first power level and said second power level where said difference defines a difference in power level greater than a normal transmission in said format; and
receiving an indication to reduce an amount of power in said transmitting, responsive to said transmitting,
wherein said signal is a burst which has at least a first set of symbols that are transmitted at a first lower power level, and a second set of symbols that are transmitted at a second higher power level.

2. A method as in claim 1, wherein said first set of symbols and said second set of symbols are interleaved together in a same portion of a transmission.

3. A method as in claim 2, wherein said first set of symbols and said second set of symbols are alternatively arranged, such that symbols from the first set are even numbered symbols, and symbols from the second set are odd numbered symbols.

4. A method, comprising:
receiving a signal that includes a burst portion with a first part at of a first power level and a second part at a second power level;
comparing differences in power from said signal parts with a known power difference between said first power level and said second power level; and
responsive to said comparing indicating that said difference between received power and known power varies by more than a specified amount, taking an action to reduce a saturation in a remote transmitter.

5. A method as in claim 4, further comprising estimating a power difference between the first power level and the second power level.

6. A method as in claim 4, wherein said comparing comprises comparing a signal-to-noise ratio between said first power level and said second power level.

7. A method as in claim 4, wherein said comparing comprises using an expectation maximization algorithm.

8. A method as in claim 7, wherein said expectation maximization is an iterative expectation maximization.

9. A method as in claim 7, wherein said signal is a QPSK signal.

10. A method as in claim 7, wherein said signal is an MPSK signal.

11. A method as in claim 7, wherein said signal is a burst having n bytes, and said burst occurs every T seconds, where T is less than 10 seconds.

12. A method as in claim 7, wherein said signal is a single burst which has at least a first set of symbols that are transmitted at a first lower power level, and a second set of symbols that are transmitted at a second higher power level.

13. A method as in claim 12, wherein said first set of symbols and said second set of symbols are interleaved together in a same portion of a transmission.

14. A method as in claim 13, wherein said first set of symbols and said second set of symbols are alternatively arranged, such that symbols from the first set are even numbered symbols, and symbols from the second set are odd number of symbols.

15. A method as in claim 7, wherein said taking an action comprises sending a signal that instructs the transmitter to reduce an amount of saturation in said transmitting.

16. A method as in claim 15, wherein said signal instructs lowering a transmit power.

17. A method as in claim 15, wherein said signal instructs changing a transmitting channel.

18. A method as in claim 17, wherein said changing a transmitting channel comprises changing to a channel that transmits at a lower symbol rate.

19. A method as in claim 17, wherein said changing a transmitting channel comprises changing to a channel that has a lower code rate.

20. A method as in claim 17, wherein said changing a transmitting channel comprises changing to a channel that has a lower order modulation scheme.

21. A method as in claim 15, wherein said signal instructs the transmitter to lower a transmit power.

22. A method as in claim 15, wherein said signal instructs the transmitter to change a transmitting channel.

23. A method as in claim 22, wherein said changing a transmitting channel comprises changing to a channel that transmits at a lower symbol rate.

24. A method as in claim 22, wherein said changing a transmitting channel comprises changing to a channel that has a lower order modulation scheme.

25. A method as in claim 22, wherein said changing a transmitting channel comprises changing to a channel that has a lower code rate.

26. A method, comprising:
in a transmitter, transmitting a signal that includes information symbols and is in a format encoded with a non-constant envelope, said signal also includes a first part at a first power level, a second part at a second power level, having a known and definite difference between said first power level and said second power level, where said difference defines a difference in power level greater than a normal transmission in said format;
receiving the signal in a receiver in said receiver, comparing differences in power between said first part and said second part with a known power difference between said first power level and said second power level;
responsive to said comparing indicating that a difference between said received power differences and known power difference varies by more than a specified amount, taking an action to reduce a saturation in said transmitter; and
responsive to said action, reducing an amount of saturation in said transmitter.

27. A method as in claim 26, wherein said signal part is a burst having n bytes, and said burst occurs every T seconds, where T is less than 10 seconds.

28. A method as in claim 26, wherein said signal is a burst which has at least a first set of symbols that are transmitted at a first lower power level, and a second set of symbols that are transmitted at a second higher power level.

29. A method as in claim 28, wherein said first set of symbols and said second set of symbols are interleaved together in a same portion of a transmission.

30. A method as in claim 29, wherein said first set of symbols and said second set of symbols are alternatively arranged, such that symbols from the first set are even numbered symbols, and symbols from the second set are odd number of symbols.

31. A method as in claim 26, wherein said reducing comprises lowering a transmit power.

32. A method as in claim 26, wherein said reducing comprises changing a transmitting channel.

33. A transmitter comprising:
a modulator, creating a signal that includes information symbols and is in a format encoded with a non-constant envelope, said signal also includes a first part at a first power level, and a second part at a second power level, having a known and definite difference between said first power level and said second power level, where said difference defines a difference in power level greater than a normal transmission in said format; and
a transmitting part, that transmits a signal over a channel having a power level and characteristics that are based on said signal from said modulator; and said transmitting part receiving an indication to reduce saturation, responsive to said transmitting and taking an action to reduce said saturation, responsive to said indication,
wherein said signal part is a burst which has at least a first set of symbols that are transmitted at a first lower power level, and a second set of symbols that are transmitted at a second higher power level.

34. A transmitter as in claim 33, wherein said first set of symbols and said second set of symbols are interleaved together in a same portion of a transmission.

35. A transmitter as in claim 34, wherein said first set of symbols and said second set of symbols are alternatively arranged, such that symbols from the first set are even numbered symbols, and symbols from the second set are odd numbered symbols.

36. A transmitter comprising:
a modulator, creating a signal that includes information symbols and is in a format encoded with a non-constant envelope, said signal also includes a first part at a first power level, and a second part at a second power level, having a known and definite difference between said first power level and said second power level, where said difference defines a difference in power level greater than a normal transmission in said format; and
a transmitting part, that transmits a signal over a channel having a power level and characteristics that are based on said signal from said modulator; and said transmitting part receiving an indication to reduce saturation, responsive to said transmitting and taking an action to reduce said saturation, responsive to said indication,
wherein said transmitter changes a transmitting channel to reduce saturation.

37. A transmitter as in claim 36, wherein said transmitter changes to a channel that transmits at a lower symbol rate.

38. A transmitter as in claim 36, wherein said transmitter changes to a channel that transmits at a lower code rate.

39. A receiver, comprising:
a receiver part, receiving and detecting a signal part that includes a burst portion with a first part at a first power level and a second part at a second power level;
a power level comparing part, comparing differences in power from said signal part with a known power difference between said first power level and said second power level; and
a signal producing part, responsive to said comparing, producing a signal indicating that said difference between received power and known power varies by more than a specified amount, said signal indicative of reducing a saturation in a remote transmitter.

40. A receiver as in claim 39, wherein said power level comparing part compares a signal-to-noise ratio between said first power level and said second power level.

41. A receiver as in claim 40, wherein said power level comparing part uses an expectation maximization technique.

42. A receiver as in claim 41, wherein said power level comparing part uses an iterative expectation maximization technique.

43. A receiver as in claim 40, wherein said signal part is a MPSK signal part.

44. A receiver as in claim 39, wherein said signal part is a burst having n bytes, and said burst occurs every T seconds, where T is less than 5 seconds.

45. A receiver as in claim 39, wherein said signal part is a single burst which has at least a first set of symbols that are transmitted at a first lower power level, and a second set of symbols that are transmitted at a second higher power level.

46. A receiver as in claim 45, wherein said first set of symbols and said second set of symbols are interleaved together in a same portion of a transmission.

47. A receiver as in claim 46, wherein said first set of symbols and said second set of symbols are alternatively arranged, such that symbols from the first set are even numbered symbols, and symbols from the second set are odd numbered symbols.

48. A receiver as in claim 41, wherein said taking an action comprises sending a signal that instructs the transmitter to reduce an amount of saturation in said transmitting.

49. A receiver as in claim 39, wherein said signal instructs the transmitter to lower a transmit power.

50. A receiver as in claim 39, wherein said signal instructs the transmitter to change a transmitting channel.

* * * * *

UNITED STATES PATENT AND TRADEMARK OFFICE
CERTIFICATE OF CORRECTION

| | | |
|---|---|---|
| PATENT NO. | : 7,894,510 B2 | Page 1 of 1 |
| APPLICATION NO. | : 11/772781 | |
| DATED | : February 22, 2011 | |
| INVENTOR(S) | : Miller et al. | |

It is certified that error appears in the above-identified patent and that said Letters Patent is hereby corrected as shown below:

In Claim 4, column 10, line 37, please delete "of".

Signed and Sealed this
Twenty-eighth Day of June, 2011

David J. Kappos
*Director of the United States Patent and Trademark Office*